(12) United States Patent
Kaya et al.

(10) Patent No.: US 10,008,919 B2
(45) Date of Patent: Jun. 26, 2018

(54) SEMICONDUCTOR DEVICE

(71) Applicant: Renesas Electronics Corporation, Tokyo (JP)

(72) Inventors: Yoshinori Kaya, Tokyo (JP); Yasushi Nakahara, Tokyo (JP); Azuma Araya, Tokyo (JP); Ryo Kanda, Tokyo (JP); Tomonobu Kurihara, Tokyo (JP); Tetsu Toda, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 227 days.

(21) Appl. No.: 15/043,253

(22) Filed: Feb. 12, 2016

(65) Prior Publication Data

US 2016/0164398 A1 Jun. 9, 2016

Related U.S. Application Data

(63) Continuation of application No. 14/517,657, filed on Oct. 17, 2014, now Pat. No. 9,287,256.

(30) Foreign Application Priority Data

Oct. 30, 2013 (JP) ................................. 2013-225360

(51) Int. Cl.
*G05F 1/565* (2006.01)
*G05F 1/00* (2006.01)
(Continued)

(52) U.S. Cl.
CPC ........ *H02M 1/088* (2013.01); *H01L 27/0285* (2013.01); *H01L 27/0292* (2013.01);
(Continued)

(58) Field of Classification Search
CPC ......... H03K 17/04106; H03K 17/0412; H03K 17/04123
(Continued)

(56) References Cited

U.S. PATENT DOCUMENTS 5,373,435 A 12/1994 Jayaraman et al.
7,518,352 B2 * 4/2009 De Lima Filho ....... G05F 1/575
323/284
(Continued)

FOREIGN PATENT DOCUMENTS

CN 1109699 A 10/1995
CN 103000629 A 3/2013
(Continued)

OTHER PUBLICATIONS

European Search Report dated Mar. 31, 2015.
(Continued)

*Primary Examiner* — Gary Nash
(74) *Attorney, Agent, or Firm* — McGinn IP Law Group, PLLC

(57) ABSTRACT

A method of controlling a power supply to a semiconductor device including a first region having a high-side drive circuit, a second region having a signal processing circuit, a low-side drive circuit and a voltage control circuit, and a separation region formed between the first and second regions and having a rectifying element, includes turning on a first control signal to the voltage control circuit, turning off the first control signal to the voltage control circuit, and repeating the turning on of the first control signal and the turning off the first control signal.

14 Claims, 10 Drawing Sheets

(51) Int. Cl.
| | |
|---|---|
| *H03K 17/687* | (2006.01) |
| *H02M 1/088* | (2006.01) |
| *H01L 27/06* | (2006.01) |
| *H01L 29/06* | (2006.01) |
| *H01L 27/02* | (2006.01) |
| *H01L 29/78* | (2006.01) |
| *H01L 27/092* | (2006.01) |
| *H01L 29/10* | (2006.01) |
| *H01L 29/40* | (2006.01) |
| *H01L 29/08* | (2006.01) |
| *H01L 29/423* | (2006.01) |

(52) U.S. Cl.
CPC ...... *H01L 27/0296* (2013.01); *H01L 27/0629* (2013.01); *H01L 27/0922* (2013.01); *H01L 29/0642* (2013.01); *H01L 29/0847* (2013.01); *H01L 29/1033* (2013.01); *H01L 29/1079* (2013.01); *H01L 29/405* (2013.01); *H01L 29/7816* (2013.01); *H01L 29/7835* (2013.01); *H01L 29/7838* (2013.01); *H01L 29/0878* (2013.01); *H01L 29/42368* (2013.01); *H03K 2017/6875* (2013.01); *H03K 2217/0081* (2013.01)

(58) Field of Classification Search
USPC ........ 323/275, 285, 289, 350; 327/416, 423, 327/424, 427, 434, 436
See application file for complete search history.

(56) References Cited

U.S. PATENT DOCUMENTS

| | | | |
|---|---|---|---|
| 7,812,402 B2 | 10/2010 | Hatade | |
| 8,324,684 B1 | 12/2012 | Pernyeszi | |
| 2003/0218186 A1* | 11/2003 | Hano | H01L 27/0629 257/197 |
| 2004/0195644 A1 | 10/2004 | Mallikarjunaswamy et al. | |
| 2005/0168206 A1* | 8/2005 | Nadd | H02M 1/08 323/285 |
| 2005/0194656 A1 | 9/2005 | Shimizu | |
| 2007/0159150 A1* | 7/2007 | Hosokawa | H02M 3/1588 323/285 |
| 2009/0273028 A1 | 11/2009 | Mallikarjunaswamy et al. | |
| 2010/0259238 A1* | 10/2010 | Cheng | H02M 1/36 323/282 |
| 2010/0283116 A1 | 11/2010 | Shimiuz | |
| 2012/0267750 A1 | 10/2012 | Imai et al. | |
| 2013/0328104 A1 | 12/2013 | Jonishi | |
| 2014/0203406 A1 | 7/2014 | Shi et al. | |
| 2014/0217466 A1 | 8/2014 | Yamaji | |

FOREIGN PATENT DOCUMENTS

| | | |
|---|---|---|
| EP | 0 649 579 B1 | 4/1995 |
| JP | 2004-47937 A | 2/2004 |
| JP | 2006-005182 A | 1/2006 |
| WO | WO 94/27370 | 11/1994 |
| WO | WO 2013/069408 A1 | 5/2013 |

OTHER PUBLICATIONS

Japanese Office Action dated Jul. 11, 2017, in Japanese Patent Application No. 2013-225360, with an English translation thereof.
European Office Action dated Oct. 9, 2017 in European Patent Application No. 14 188 677.0-1552.
Chinese Office Action dated Jan. 2, 2018 in corresponding Chinese Patent Application No. 201410594450.8, with an English translation thereof.

* cited by examiner

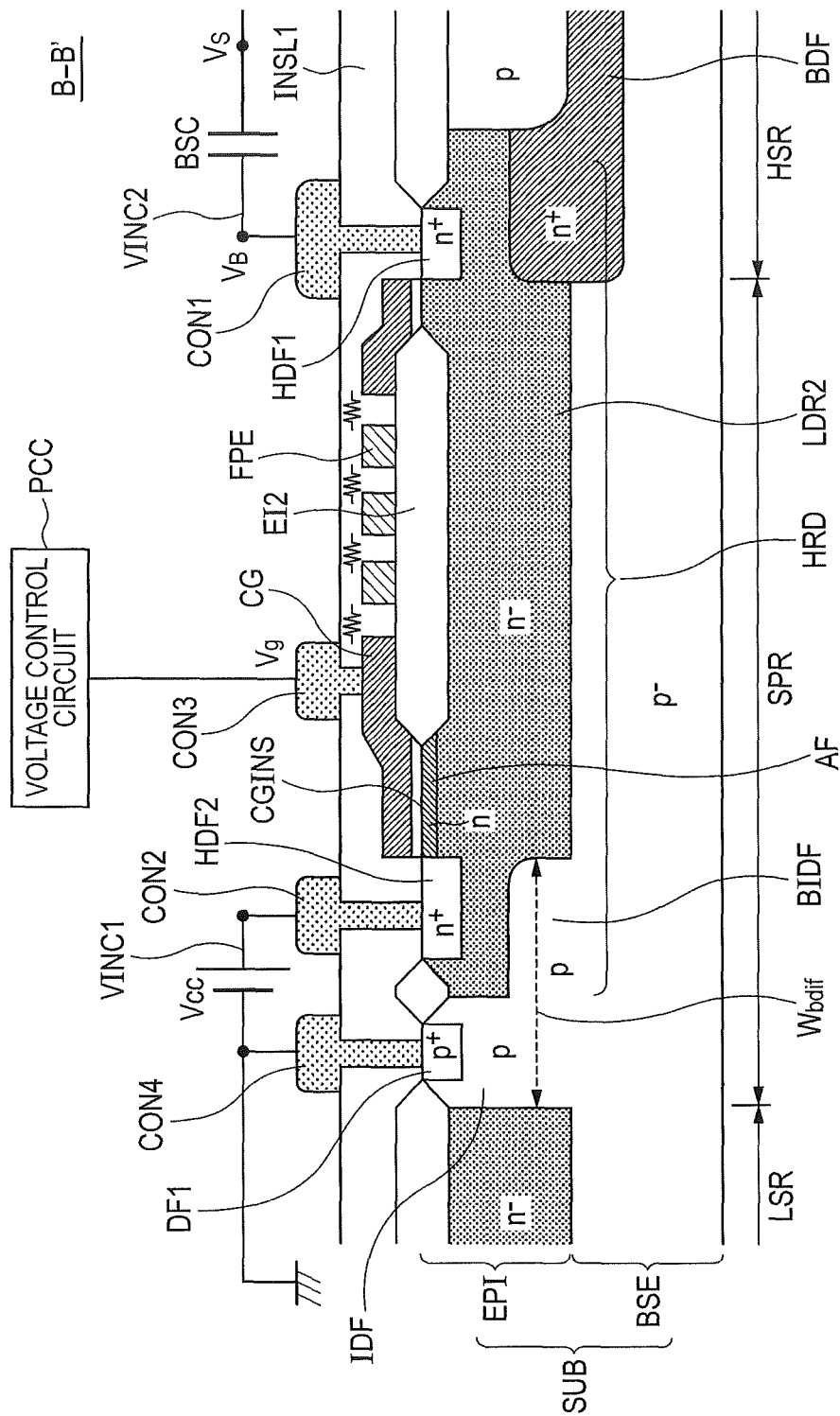

SEMICONDUCTOR DEVICE

CROSS-REFERENCE TO RELATED APPLICATIONS

This application is a Continuation application of U.S. patent application Ser. No. 14/517,657, which was filed on Oct. 17, 2014, and the disclosure of which is incorporated herein in its entirety by reference thereto.

The disclosure of Japanese Patent Application No. 2013-225360 filed on Oct. 30, 2013 including the specification, drawings and abstract is incorporated herein by reference in its entirety.

BACKGROUND

The present invention relates to a semiconductor device, and a technology applicable to a semiconductor device having two circuits different in power supply voltage from each other, for example.

As one of semiconductor devices, there has been known one in which a control circuit that generates a control signal for a power control element has been integrated. In such a semiconductor device, a power supply voltage for the power control element is higher than that for the control circuit. Therefore, a second control circuit may be provided between the control circuit and the power control element to input the control signal to the power control element. A power supply voltage for the second control circuit is generally higher than that for the control circuit. Therefore, in such a semiconductor device, the second control circuit needs to be separated from each circuit low in power supply voltage.

There has been described in, for example, a Patent Document 1 that the input of a signal to a high-voltage side drive circuit being a second control circuit is done through a level shift circuit. Further, in the Patent Document 1, a power supply voltage for the high-voltage side drive circuit is generated using a power supply voltage for a control circuit. Then, the power supply voltage for the control circuit and the power supply voltage for the high-voltage side drive circuit are separated from each other using a p channel type MOS transistor.

RELATED ART DOCUMENTS

Patent Document

[Patent Document 1] Japanese Unexamined Patent Application Publication No. 2006-5182

SUMMARY

In general, a diode is often used when preventing a reverse flow of current between two circuits. The present inventors have found that the following problems arise when a diode is used in a structure of separating a power supply voltage for a first circuit and a power supply voltage for a second circuit from each other where the first circuit and the second circuit lower in power supply voltage than the first circuit are formed in one substrate, and the power supply voltage for the first circuit is generated using the power supply voltage for the second circuit. Described specifically, since the diode is configured by a PN junction, a voltage of at least 0.7V or so is required to be applied between a P-side terminal and an N-side terminal when a current is made to flow in a forward direction. In other words, when the PN junction is interposed when the power supply voltage for the second circuit is carried to the power supply voltage for the first circuit, a voltage loss occurs due to this junction. Consequently, there is a possibility that the power supply voltage is reduced, whereby a loss in power increases and a malfunction occurs.

Incidentally, since the p channel type transistor is required to be provided in a structure described in the Patent Document 1, a semiconductor device is increased in size correspondingly.

Therefore, the present inventors have discussed a structure which is capable of separating the power supply voltage for the first circuit and the power supply voltage for the second circuit from each other without using the PN junction and prevents an increase in size of the semiconductor device. Other objects and novel features will become apparent from the description of the present specification and the accompanying drawings.

According to one embodiment, a semiconductor device has a first circuit region, a second circuit region and a separation region. A first circuit is provided in the first circuit region, and a second circuit is provided in the second circuit region. A power supply voltage for the second circuit is lower than a power supply voltage for the first circuit. The separation region surrounds the first circuit region. The second circuit region is positioned outside the separation region. The separation region has a second conductivity type layer, a first high concentration second conductivity type region, a second high concentration second conductivity type region, an element isolation film, a first insulation layer, and a first conductive film. The first high concentration second conductivity type region and the second high concentration second conductivity type region are formed in the second conductivity type layer. The first high concentration second conductivity type region and the second high concentration second conductivity type region are separated from each other. The element isolation film is positioned between the first high concentration second conductivity type region and the second high concentration second conductivity type region and away from the second high concentration second conductivity type region. The first insulation layer is formed over a region positioned between the second high concentration second conductivity type region and the element isolation film in an epitaxial layer. The first conductive film is formed over the first insulation layer. A first contact is coupled to the first high concentration second conductivity type region, a second contact is coupled to the second high concentration second conductivity type region, and a third contact is coupled to the first conductive film. The first, second and third contacts are separated from each other.

According to the one embodiment, it is possible to separate the power supply voltage for the first circuit and the power supply voltage for the second circuit from each other without using the PN junction and suppress an increase in the size of the semiconductor device.

BRIEF DESCRIPTION OF THE DRAWINGS

FIG. 10 is a cross-sectional diagram for describing a configuration of a semiconductor device according to a second embodiment.

DETAILED DESCRIPTION

Figure 1:
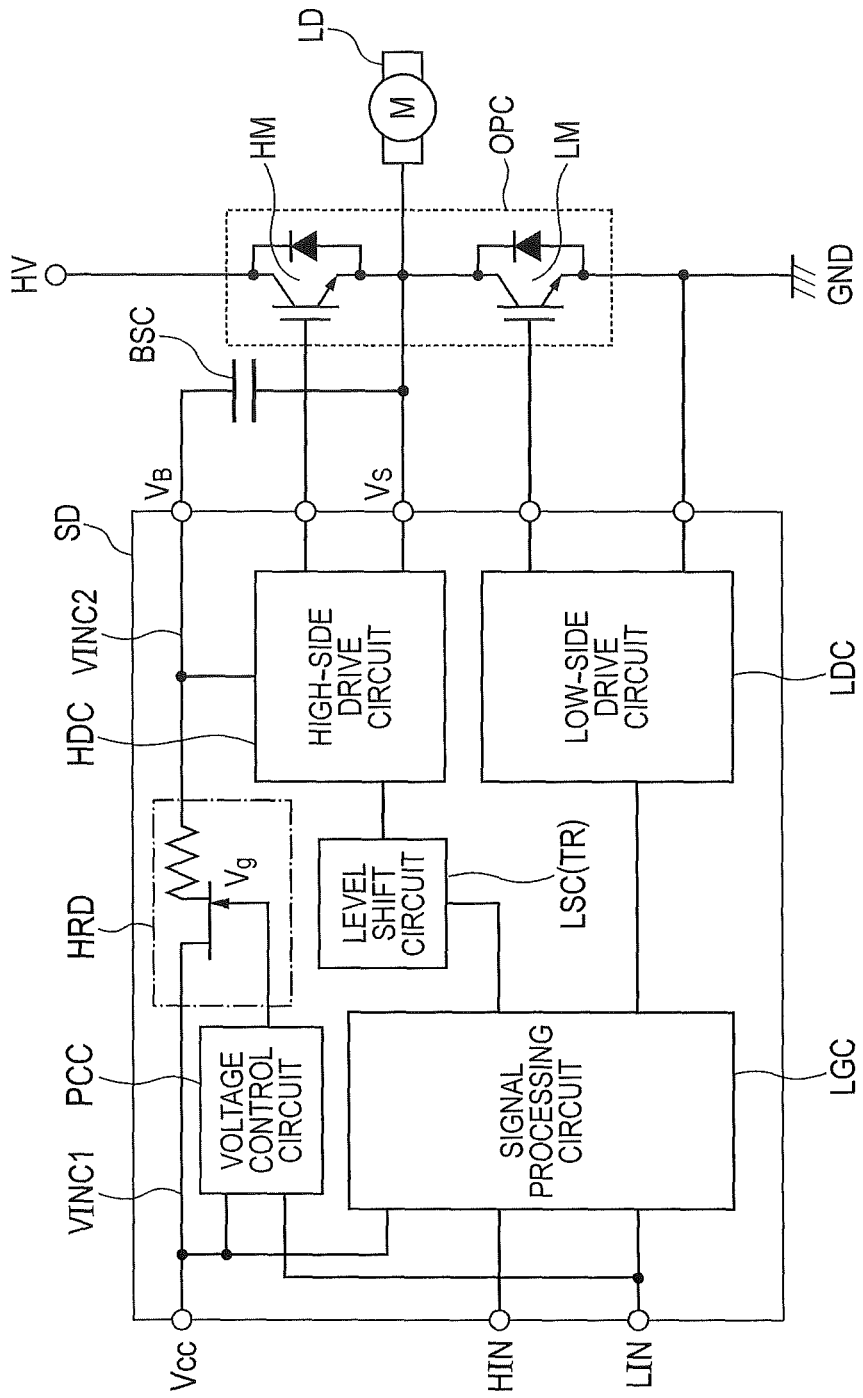
FIG. 1 is a functional block diagram of an electrical apparatus in which a semiconductor device according to a first embodiment is used.

Preferred embodiments will hereinafter be described using the accompanying drawings. Incidentally, in all of the drawings, the same reference numerals are respectively attached to like components in all the drawings, and their description will be omitted as appropriate.

First Embodiment

FIG. 1 is a functional block diagram of an electrical apparatus in which a semiconductor device SD according to a first embodiment is used. The semiconductor device SD is a device for applying a control signal to a power control circuit OPC. The power control circuit OPC controls a load LD, e.g., power inputted to a motor. That is, the semiconductor device SD controls the load LD through the power control circuit OPC.

The power control circuit OPC has, for example, a plurality of planar type high breakdown voltage MOS transistors, vertical MOS transistors, bipolar transistors or IGBTs (Insulated Gate Bipolar Transistors). In the example illustrated in the present figure, the power control circuit OPC is configured as one in which a source of a first transistor HM and a drain of a second transistor LM are coupled in series, and an output terminal is provided between the first transistor HM and the second transistor LM. Incidentally, a drain of the first transistor HM is coupled to a power supply wiring for power (HV for voltage). A source of the second transistor LM is coupled to a ground wiring GND for power.

The semiconductor device SD is equipped with a signal processing circuit LGC (second circuit), a level shift circuit LSC, a high-side drive circuit HDC (first circuit), and a low-side drive circuit LDC. The high-side drive circuit HDC is coupled to a gate electrode of the first transistor HM of the power control circuit OPC. The low-side drive circuit LDC is coupled to a gate electrode of the second transistor LM thereof. Then, the high-side drive circuit HDC and the low-side drive circuit LDC are controlled by the signal processing circuit LGC. In other words, the signal processing circuit LGC controls the power control circuit OPC through the high-side drive circuit HDC and the low-side drive circuit LDC.

The signal processing circuit LGC is a logic circuit, which processes a signal inputted from outside to generate a control signal for controlling the power control circuit OPC. This control signal includes a signal to control the low-side drive circuit LDC, and a signal to control the high-side drive circuit HDC.

Since a power supply voltage for the low-side drive circuit LDC is approximately equal to a power supply voltage $V_{cc}$ for the signal processing circuit LGC, the signal to control the low-side drive circuit LDC is directly inputted from the signal processing circuit LGC to the low-side drive circuit LDC. In contrast, since a power supply voltage $V_B$ (first voltage) for the high-side drive circuit HDC is higher than the power supply voltage $V_{cc}$ (second voltage) for the signal processing circuit LGC. Therefore, the signal to control the high-side drive circuit HDC is inputted to the high-side drive circuit HDC through the level shift circuit LSC. Incidentally, the level shift circuit LSC has a coupling transistor TR. The details of the coupling transistor TR will be described later.

The power supply voltage $V_B$ for the high-side drive circuit HDC is generated from the power supply voltage $V_{cc}$ for the signal processing circuit LGC. The power supply voltage $V_{cc}$, rectifying element HRD, power control circuit OPC and capacitive element BSC are used for the generation of the power supply voltage $V_B$. The capacitive element BSC is a bootstrap capacitor, for example. One terminal of the capacitive element BSC is coupled to the output terminal of the power control circuit OPC, and the other terminal of the capacitive element BSC is coupled to a power supply wiring VINC2 of the high-side drive circuit HDC.

The rectifying element HRD is provided between the power supply wiring VINC2 and a power supply wiring VINC1 of the signal processing circuit LGC. A voltage control circuit PCC is coupled to the rectifying element HRD. The voltage control circuit PCC inputs a signal to the rectifying element HRD. The details of the rectifying element HRD and the voltage control circuit PCC will be described later.

Incidentally, a control signal HIN for controlling the first transistor HM and a control signal LIN for controlling the second transistor LM are inputted to the signal processing circuit LGC. The signal processing circuit LGC controls the high-side drive circuit HDC based on the control signal HIN and controls the low-side drive circuit LDC based on the control signal LIN.

Further, the control signal LIN is inputted even to the voltage control circuit PCC. The voltage control circuit PCC inputs a signal to the rectifying element HRD based on the control signal LIN. Therefore, the signal inputted to the rectifying element HRD can be synchronized with ON/OFF of the second transistor LM. Here, the control signal HIN may be used in place of the control signal LIN. In this case, the signal inputted to the rectifying element HRD can be synchronized with ON/OFF of the first transistor HM.

Incidentally, in FIG. 1, the resistance that the rectifying element HRD has indicates a resistance due to a second conductivity type layer LDR2 to be described latter.

Figure 2:
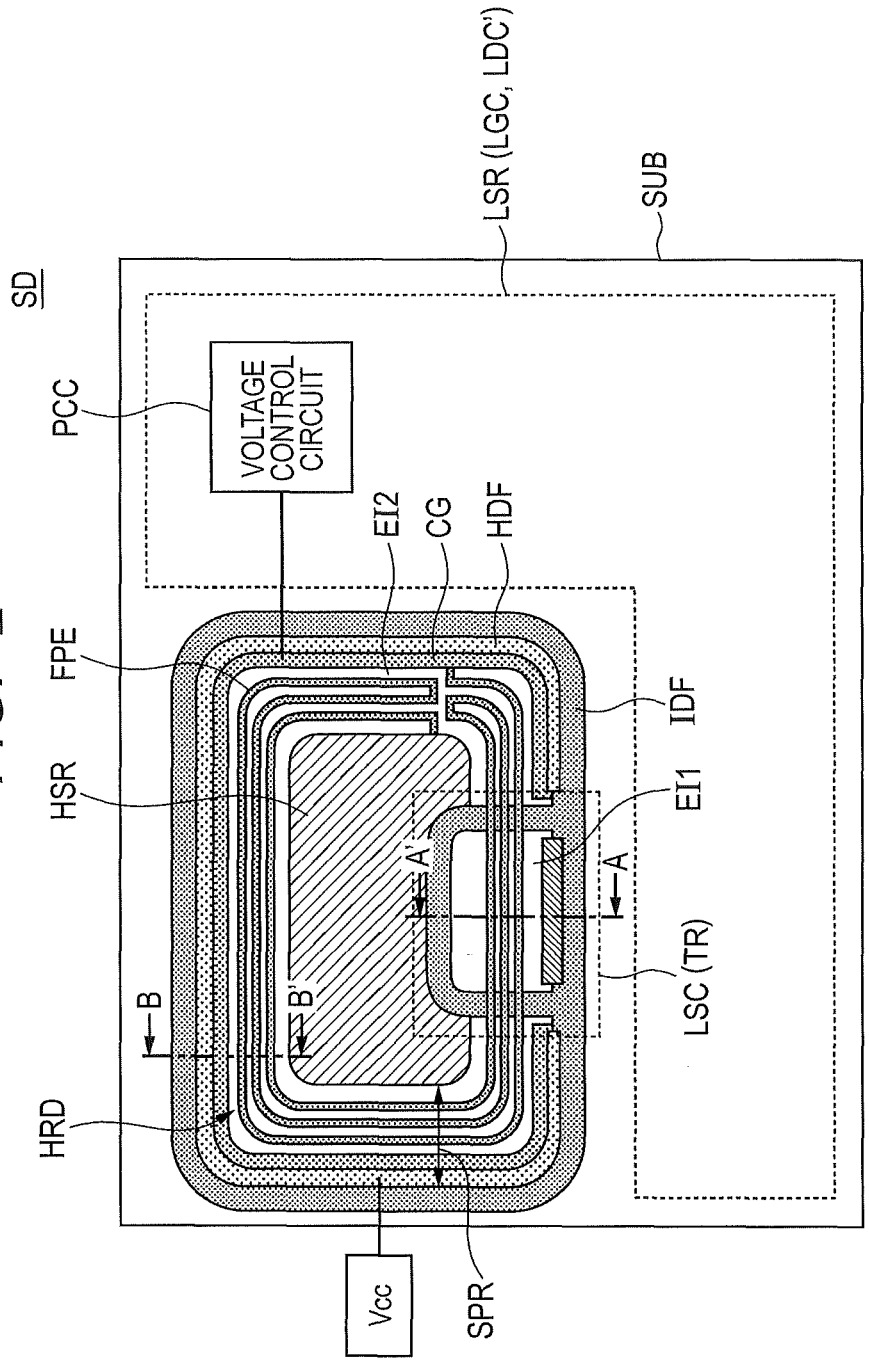
FIG. 2 is a plan diagram showing a configuration of a semiconductor device.

FIG. 2 is plan diagram showing a configuration of a semiconductor device SD. The semiconductor device SD has a first circuit region HSR, a separation region SPR, a second circuit region LSR, and a coupling transistor TR.

The first circuit region HSR has a high-side drive circuit HDC. The second circuit region LSR has a low-side drive circuit LDC, a signal processing circuit LGC and a voltage control circuit PCC.

The first circuit region HSR is arranged with its periphery surrounded by the separation region SPR. In other words, the first circuit region HSR and the second circuit region LSR are separated by the separation region SPR. Thus, circuits having different power supply potentials can be formed in one substrate SUB.

Further, a first conductivity type region IDF is formed in the outermost periphery of the separation region SPR. As will be described later, the first conductivity type region IDF is formed in the substrate SUB. A field plate electrode FPE and a rectifying element HRD are formed in a region of the separation region SPR, which is located inside than the first conductivity type region IDF. The details of their sectional structures will be described later.

A coupling transistor TR is formed in the separation region SPR. Since the first circuit region HSR is rectangular in the example illustrated in the present figure, the separation region SPR also has a shape extending along the edges of the rectangle. In the example shown in the present figure, the coupling transistor TR is positioned over the long side of the rectangle drawn by the separation region SPR. The position of the coupling transistor TR is however not limited to the example shown in the present figure. The coupling transistor TR is surrounded by the first conductivity type region IDF. Incidentally, the above rectifying element HRD is formed in the portion of the separation region SPR not including the region formed with the coupling transistor TR. On the other hand, the field plate electrode FPE is positioned over the separation region SPR and repeatedly surrounds the whole circumference of the first circuit region HSR. When the field plate electrode FPE is folded back here, the field plate electrode FPE surrounds the whole circumference of the first circuit region HSR except for its return points.

Here, the conductivity type of a drain and source of the coupling transistor TR will be taken to be a second conductivity type (e.g., n type). Of the substrate SUB, a portion positioned in the separation region SPR and portions positioned in the first circuit region HSR and the second circuit region LSR also serve as the second conductivity type.

Incidentally, in the example shown in the present figure, the substrate SUB is approximately rectangular. The first circuit region HSR is arranged close to one corner of the substrate SUB. Other circuits are not arranged between one long side (upper side in the example shown in the present figure) of the first circuit region HSR and one short side (left side in the example shown in the present figure), and the sides closest to these sides, of the substrate SUB. The position of the first circuit region HSR is however not limited to the example shown in the present figure.

Figure 3:
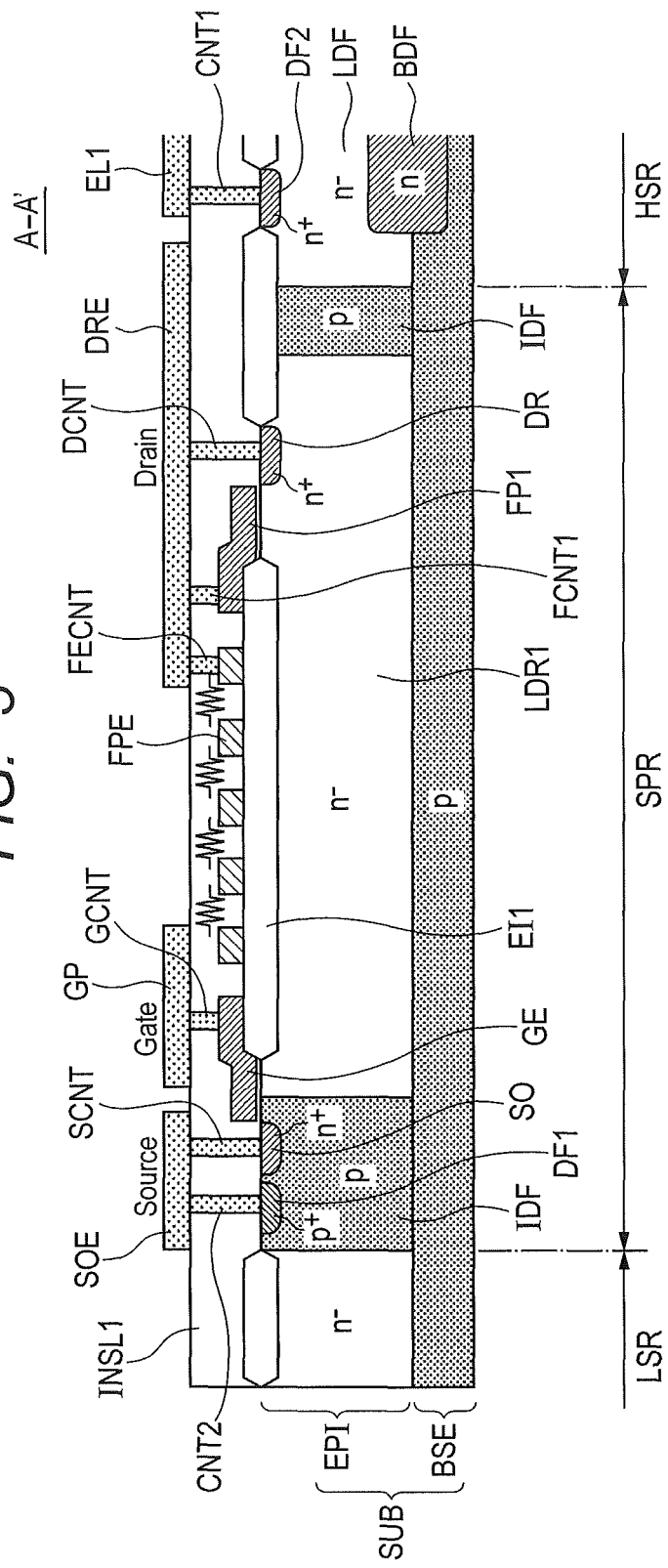
FIG. 3 is a cross-sectional diagram taken along line A-A' of FIG. 2.

FIG. 3 is a cross-sectional diagram taken along line A-A' of FIG. 2. In the example shown in the present figure, the substrate SUB is formed by epitaxially growing a second conductivity type (e.g., n⁻ type) epitaxial layer EPI (e.g., silicon layer) over a first conductivity type (e.g., p type) substrate BSE (e.g., silicon substrate) that serves as a base. A second conductivity type (e.g., n⁺ type) buried diffusion layer BDF is formed in the region of the substrate SUB, which serves as the first circuit region HSR. The buried diffusion layer BDF is provided from the upper portion of the substrate BSE to the bottom of the epitaxial layer EPI in the thickness direction of the substrate SUB.

As described above, the periphery of the coupling transistor TR is surrounded by the first conductivity type region IDF. As shown in FIG. 3, the first conductivity type region IDF is formed in the entire epitaxial layer EPI in its depth direction. Therefore, the lower end of the first conductivity type region IDF is coupled to the substrate SUB.

Further, the coupling transistor TR has a source SO and a drain DR of a second conductivity type, and a gate electrode GE. The source SO, the gate electrode GE and the drain DR are arranged in the direction (e.g., orthogonal direction) intersecting the edge of the first circuit region HSR. Specifically, the drain DR, the gate electrode GE and the source SO are arranged in this order in the direction from the first circuit region HSR to the second circuit region LSR.

In the example shown in the present figure, the coupling transistor TR is a drain offset type transistor and is formed using the epitaxial layer EPI.

More specifically, an element isolation film EI1 is formed between the drain DR and the gate electrode GE. The gate electrode GE is partially positioned over the element isolation film EI1. Further, the source SO is formed in a portion of the first conductivity type region IDF, which is positioned at the outer periphery of the separation region SPR. A portion (i.e., a portion positioned between the drain DR and the gate electrode GE as viewed in a planar view) of the epitaxial layer EPI, which is positioned below the element isolation film EI1, becomes a second conductivity type (e.g., n⁻ type) drift region LDR1.

Further, a field plate electrode FPE is formed over the element isolation region EI1 disposed between the gate electrode GE and the drain DR. Of the element isolation film EI1, the edge on the drain DR side is covered with the field plate electrode FP1. The gate electrode GE, the field plate electrode FPE and the field plate electrode FP1 are all formed in the same process. Therefore, they are formed of the same material (e.g., polysilicon) as each other. At least one of the gate electrode GE, the field plate electrode FPE and the field plate electrode FP1 may however be formed in a process different from others.

A drain electrode DRE, a source electrode SOE and a gate plate electrode GP are formed over the substrate SUB. At least one interlayer insulation film INSL1 is formed between these electrodes and the substrate SUB. These electrodes are formed of a metal such as Al and formed in the same process as each other.

The drain electrode DRE is coupled to the drain DR through a contact DCNT and coupled to the field plate electrode FP1 through a contact FCNT1. Further, the drain electrode DRE is coupled to the field plate electrode FPE through a contact FECNT.

The gate plate electrode GP is coupled to the gate electrode GE through a contact GCNT. The source electrode SOE is coupled to the source SO through a contact SCNT. The source electrode SOE is coupled to a first conductivity type diffusion layer DF1 formed in the first conductivity type region IDF through a contact CNT2. Thus, a source potential (e.g., a ground potential) is applied to the first conductivity type region IDF.

Incidentally, an electrode EL1 is also formed in the same layer as the drain electrode DRE. The electrode EL1 is coupled to a second conductivity type diffusion layer DF2 positioned in the first circuit region HSR through a contact CNT1. Thus, a second conductivity type layer LDF positioned in the first circuit region HSR is applied with a power supply potential for the first circuit region HSR through the electrode EL1.

Figure 4:
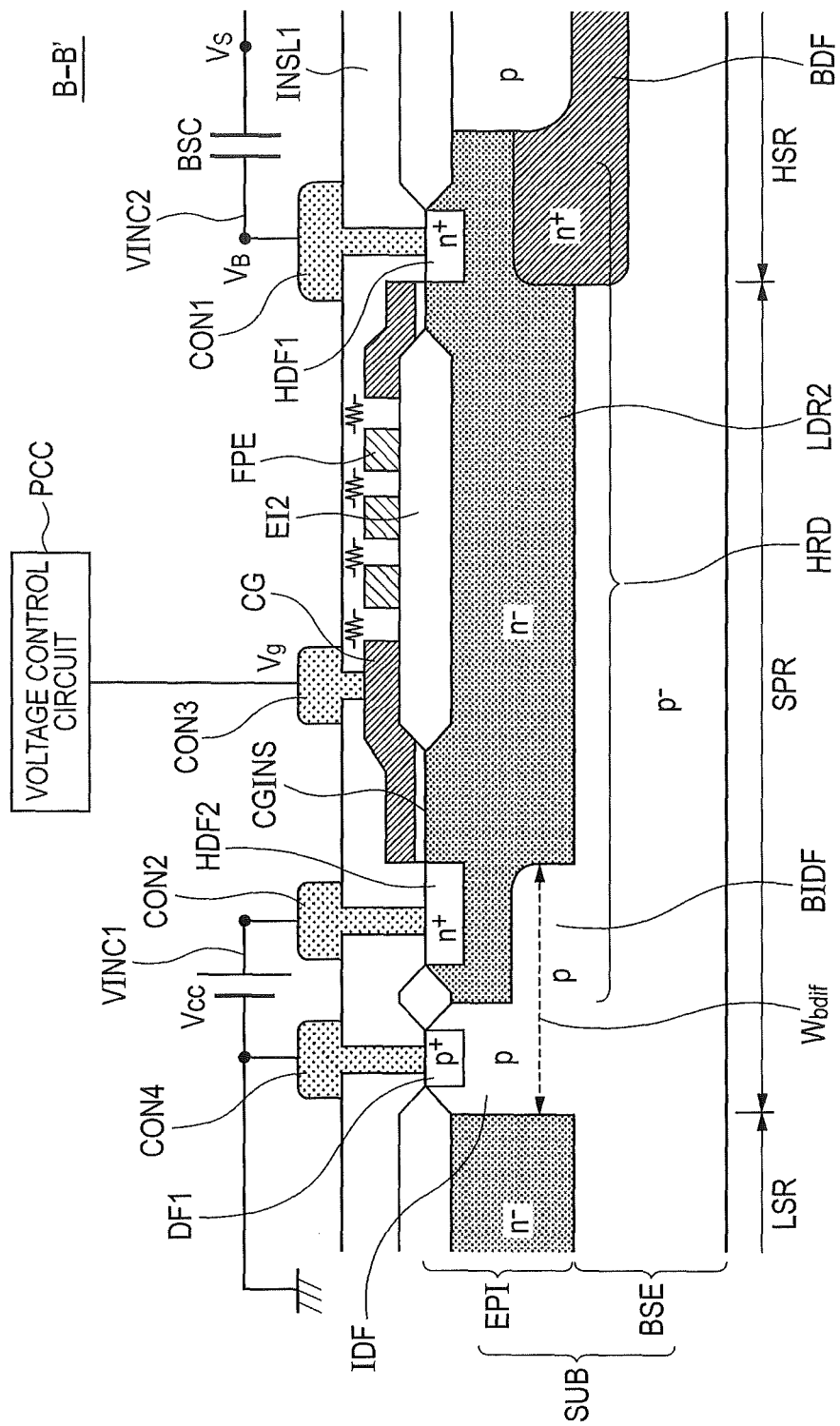
FIG. 4 is a cross-sectional diagram taken along line B-B' of FIG. 2.

FIG. 4 is a cross-sectional diagram taken along line B-B' of FIG. 2. As shown in the present figure, the rectifying element HRD is provided with the second conductivity type layer LDR2, a first high concentration second conductivity type region HDF1, a second high concentration second conductivity type region HDF2, an element isolation film EI2, a first insulation layer CGINS and a first conductive film CG. The second conductivity type layer LDR2 is formed in the substrate SUB and is a part of an impurity non-introduced region in the epitaxial layer EPI. The first high concentration second conductivity type region HDF1 and the second high concentration second conductivity type region HDF2 are formed in the second conductivity type layer LDR2. The first high concentration second conductivity type region HDF1 and the second high concentration second conductivity type region HDF2 are separated from each other. The element isolation film EI2 is formed in the epitaxial layer EPI and located between the first high concentration second conductivity type region HDF1 and the second high concentration second conductivity type region HDF2. Then, the element isolation film EI2 are separated from the second high concentration second conductivity type region HDF2. The first insulation layer CGINS is formed over a region of the epitaxial layer EPI, which is positioned between the second high concentration second conductivity type region HDF2 and the element isolation film EI2. The first conductive film CG is formed over the first insulation layer CGINS.

A first contact CON1 is coupled to the first high concentration second conductivity type region HDF1. A second contact CON2 is coupled to the second high concentration second conductivity type region HDF2. A third contact CON3 is coupled to the first conductive film CG. These contacts are embedded in the interlayer insulation film INSL1. Further, the first contact CON1, the second contact CON2 and the third contact CON3 are separated from each other. In the present embodiment, the first contact CON1 is coupled to its corresponding power supply wiring VINC2, and the second contact CON2 is coupled to its corresponding power supply wiring VINC1. Further, the third contact CON3 is coupled to the voltage control circuit PCC.

The first conductivity type region IDF vertically penetrates the epitaxial layer EPI. Therefore, the bottom surface of the first conductivity type region IDF is coupled to the substrate BSE. Also, the lower end of a fourth contact CON4 is coupled to the first conductivity type region IDF. Incidentally, the upper end of the fourth contact CON4 is coupled to a ground wiring. Of the surface layer of the first conductivity type region IDF, a region to which the fourth contact CON4 is coupled is formed with the first conductivity type diffusion layer DF1. The first conductivity type diffusion layer DF1 is higher in impurity concentration than the first conductivity type region IDF.

A lower portion BIDF of the first conductivity type region IDF is projected downwardly of the second high concentration second conductivity type region HDF2. As viewed in a planar view, the lower portion BIDF may overlap with part of the second high concentration second conductivity type region HDF2 or the entire part thereof. With the lower portion BIDF projecting toward the second high concentration second conductivity type region HDF2, a depletion layer is likely to occur in the second conductivity type layer LDR2 positioned above the lower portion BIDF in the second conductivity type layer LDR2. This effect increases with an increase in the overlap of the lower portion BIDF and the second high concentration second conductivity type region HDF2.

A method for manufacturing the semiconductor device SD will next be described. First, a substrate BSE is prepared. Next, a resist pattern is formed over the substrate BSE. A second conductivity type impurity is ion-implanted in the substrate BSE with the resist pattern as a mask. Consequently, a buried diffusion layer BDF is formed in the substrate BSE.

Thereafter, the resist pattern is removed. Next, a resist pattern is formed over the substrate BSE, and a first conductivity type impurity is ion-implanted in the substrate BSE with the resist pattern as a mask. Consequently, a part of a lower portion BIDF of a first conductivity type region IDF is formed.

Thereafter, the resist pattern is removed. Next, an epitaxial layer EPI is grown over the base BSE. Next, a resist pattern (not shown) is formed over the epitaxial layer EPI, and a first conductivity type impurity is implanted in the epitaxial layer EPI. Consequently, the remaining part of the first conductivity type region IDF is formed in the epitaxial layer EPI.

Further, the substrate BSE and the epitaxial layer EPI are heat-treated. Consequently, the impurity introduced into the epitaxial layer EPI is activated. Also, the impurity is diffused into the epitaxial layer EPI. Thus, the lower portion BIDF and the buried diffusion layer BDF extend to the bottom of the epitaxial layer EPI.

Next, element isolation films EI1 and EI2 are formed using a LOCOS oxidation method. Incidentally, the element isolation film EI may be formed using a trench isolation method.

Next, the epitaxial layer EPI is thermally oxidized. Consequently, a gate insulation film of a coupling transistor TR is formed. In this process, a first insulation layer CGINS is also formed. Then, a conductive film (e.g., polysilicon film) is formed over the gate insulation film, the first insulation layer CGINS and the element isolation films EI1 and EI2, and selectively removed. Thus, a gate electrode GE, a first conductive film CG, a field plate electrode FPE and a field plate electrode FP1 are formed.

Next, a resist pattern (not shown) is formed over the epitaxial layer EPI and the element isolation films EI1 and EI2. A second conductivity type impurity is implanted in the epitaxial layer EPI. Consequently, a first high concentration second conductivity type region HDF1, a second high concentration second conductivity type region HDF2, a source SO, a drain DR, and a diffusion layer DF2 are formed in the epitaxial layer EPI. Thereafter, the resist pattern is removed.

Next, a resist pattern is formed over the epitaxial layer EPI, and a first conductivity type impurity is implanted in the epitaxial layer EPI. Consequently, a diffusion layer DF1 is formed in the epitaxial layer EPI.

Thereafter, an interlayer insulation film INSL1 (e.g., silicon oxide film) is formed over the epitaxial layer EPI and the element isolation films EI1 and EI2. Next, the respective contacts described above are embedded in the interlayer insulation film INSL1, and a source electrode SOE, a gate plate electrode GP and a drain electrode DRE are formed over the interlayer insulation film INSL1. These are formed of, for example, Al, but may be formed of other conductive materials.

Figure 5:
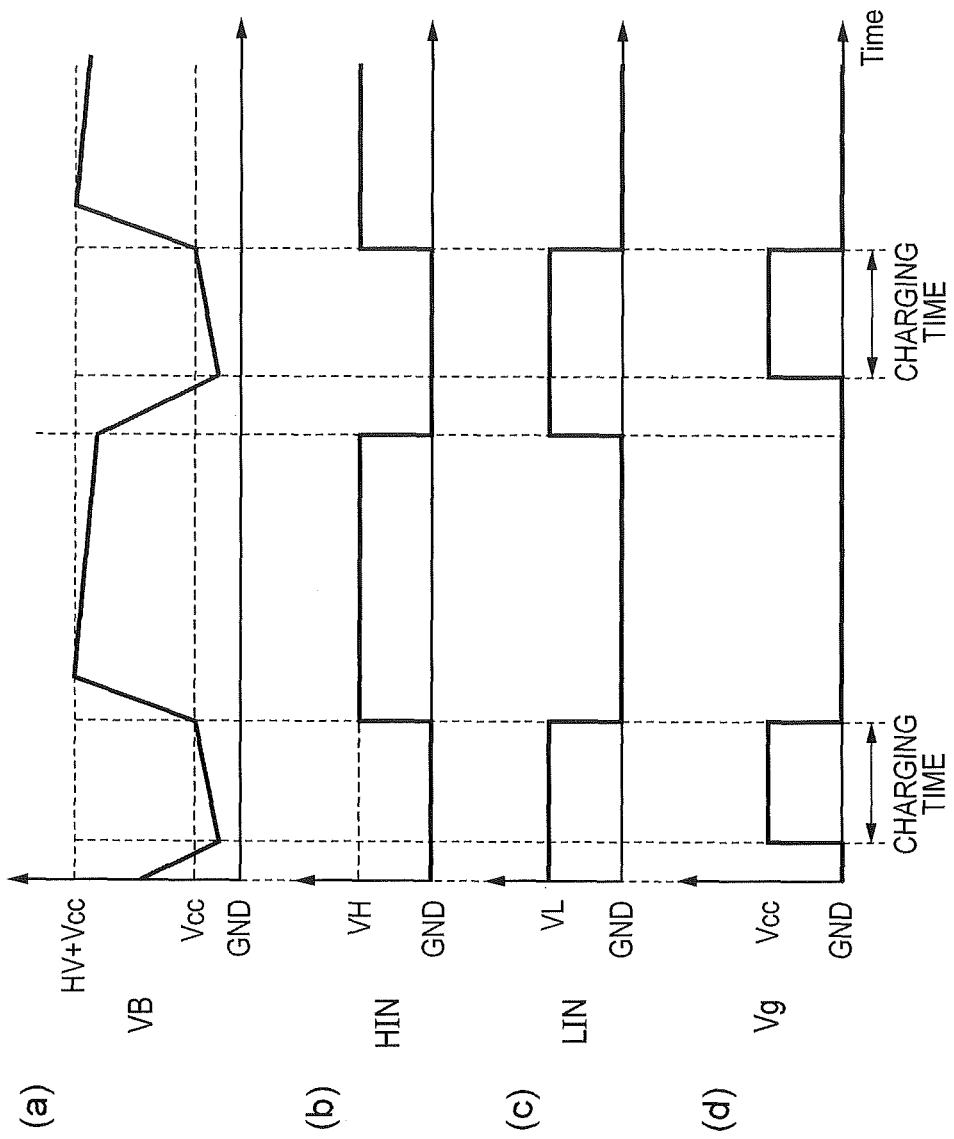
FIG. 5 is a timing chart showing the operation of the semiconductor device.

The operation of the semiconductor device SD will next be described using FIGS. 5, 1 and 4. FIG. 5 is a timing chart showing the operation of the semiconductor device SD. The semiconductor device SD is alternately inputted with a control signal HIN and a control signal LIN as shown in FIGS. 5B and 5C.

The high-side drive circuit HDC turns off the first transistor HM while the control signal LIN is being inputted to the semiconductor device SD. Further, the low-side drive circuit LDC turns on the second transistor LM to apply a ground potential to one terminal of the capacitive element BSC. In this state, the voltage control circuit PCC applies a voltage $V_{cc}$ to the first conductive film CG of the rectifying element HRD as shown in FIG. 5D. Then, a large number of carriers are collected in the region of the second conductivity type layer LDR2, which is positioned below the first conductive film CG. A portion of the second conductivity type layer LDR2, which is positioned between the second high concentration second conductivity type region HDF2 and the first high concentration second conductivity type region HDF1 becomes an undepleted state. Thus, current flows from the second high concentration second conductivity type region HDF2 to the first high concentration second conductivity type region HDF1, so that electric charges are accumulated in the capacitive element BSC. Incidentally, since carriers collected when the rectifying element HRD is turned on are majority carriers, the response speed at the turning on of the rectifying element HRD is fast.

Incidentally, in the example shown in the present figure, the timing at which a voltage $V_L$ starts to be applied to the first conductive film CG is delayed slightly from the input of the control signal LIN. This is because after one electrode of the capacitive element BSC is grounded, the power supply voltage $V_{cc}$ is applied to the other electrode of the capacitive element BSC.

Further, as shown in FIG. 5A, a voltage applied to the capacitive element BSC, i.e., a voltage $V_B$ for the power supply wiring VINC2 gradually rises as the electric charges are accumulated in the capacitive element BSC, and finally reaches the power supply voltage $V_{cc}$ for the signal processing circuit LGC.

Then, the control signal LIN is turned off and instead the control signal HIN is turned on.

When the control signal LIN is tuned off, the voltage control circuit PCC applies the ground voltage GND to the first conductive film CG of the rectifying element HRD as shown in FIG. 5D. Then, no carriers are collected in the region positioned below the first conductive film CG in the second conductivity type layer LDR2. On the other hand, the first conductivity type substrate BSE is bonded to the bottom surface of the second conductivity type layer LDR2. Therefore, a depletion layer spreads from the bottom surface of the second conductivity type layer LDR2, and finally the entire second conductivity type layer LDR2 is depleted. As a result, no current flows between the first high concentration second conductivity type region HDF1 and the second high concentration second conductivity type region HDF2. That is, the rectifying element HRD is turned off.

In the present embodiment, since the lower portion BIDF of the first conductivity type region IDF extends downward of the second high concentration second conductivity type region HDF2, the region positioned in the periphery of the second high concentration second conductivity type region HDF2 in the second conductivity type layer LDR2 becomes easily depleted in particular. Accordingly, the rectifying element HRD is turned off quickly.

Further, the second transistor LM is turned off and the first transistor HM is turned on. Thus, a voltage HV is applied to one terminal of the capacitive element BSC. Therefore, the voltage $V_B$ of the other terminal of the capacitive element BSC, i.e., the power supply wiring VICN2 is also raised and finally reaches $HV+V_{cc}$.

Incidentally, since the rectifying element HRD is off as described above, no current flows from the power supply wiring VINC2 to the power supply wiring VINC1 even if the voltage of the power supply wiring VINC2 becomes $HV+V_{cc}$.

Thereafter, the high-side drive circuit HDC is operated using power accumulated in the capacitive element BSC. Therefore, the voltage $V_B$ of the power supply wiring VICN2 is gradually reduced as shown in FIG. 5A.

Further, the control signal HIN is turned off and instead the control signal LIN is turned on. Then, the rectifying element HRD is turned on so that the voltage $V_B$ of the power supply wiring VINC2 is reduced as shown in FIG. 5A. Afterwards, the voltage control circuit PCC applies the voltage $V_L$ to the first conductive film CG of the rectifying element HRD. This operation is repeated.

Thus, according to the present embodiment, the power supply wiring VINC2 and the power supply wiring VINC1 are separated by the rectifying element HRD. Since the rectifying element HRD is formed of the second conductivity type layer LDR2, the first high concentration second conductivity type region HDF1, the second high concentration second conductivity type region HDF2, the element isolation film EI2, the first insulation layer CGINS, and the first conductive film CG, no pn junction is interposed in the current path of the rectifying element HRD. Accordingly, when the voltage $V_B$ for the power supply wiring VINC2 is generated, a voltage loss caused by the pn junction does not occur. Since the rectifying element HRD is provided in the separation region SPR, the semiconductor device SD is not enlarged.

Further, since a backward voltage is obtained for a diode comprised of the second conductivity type layer LDR2 and the substrate BSE even if the voltage of the second high concentration second conductivity type region HDF2 is increased, the current leaking in the substrate BSE is not almost generated.

Incidentally, in the present embodiment, the voltage control circuit PCC may apply a fixed potential to the first conductive film CG without being synchronized with the control signal LIN. In this case, the voltage applied to the first conductive film CG by the voltage control circuit PCC is greater than or equal to the ground voltage and less than or equal to the power supply voltage $V_{cc}$, for example. This reason will be described later, using FIG. 8.

When the voltage applied to the first high concentration second conductivity type region HDF1 becomes high (the potential of the power supply voltage $V_B$ becomes high), the carriers are pushed out of the region positioned around the second high concentration second conductivity type region HDF2 in the second conductivity type layer LDR2 by an electric field caused by the fixed potential applied to the first conductive film CG, so that the portion positioned around at least the second high concentration second conductivity type region HDF2 in the second conductivity type layer LDR2 is depleted. Consequently, the rectifying element HRD is turned off. Therefore, no current flows from the first circuit region HSR to the second circuit region LSR even without use of the pn junction.

However, the voltage control circuit PCC preferably performs the operation shown in FIG. 5 because the rectifying characteristics of the rectifying element HRD can reliably be obtained as will be described using FIG. 8.

Figure 6:
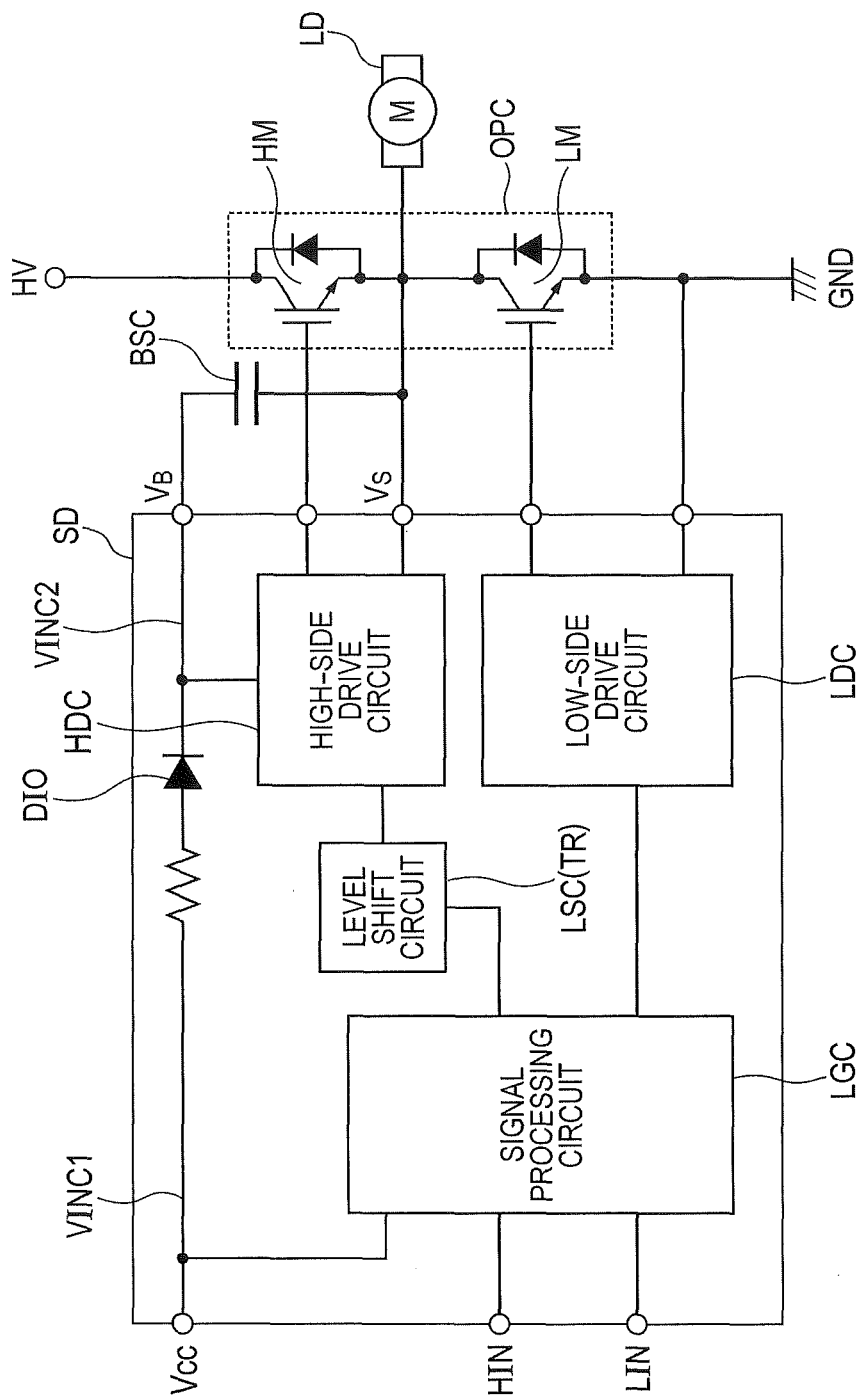
FIG. 6 is a block diagram illustrating a configuration of a semiconductor device according to a comparative example.

Advantageous effects of the present embodiment will be described using a comparative example shown in FIG. 6. A semiconductor device SD shown in FIG. 6 has a diode DIO in place of the rectifying element HRD and the voltage control circuit PCC. There are two cases where the diode DIO is externally coupled to the semiconductor device SD (comparative example 1), and where the diode DIO is built in the semiconductor device SD (comparative example 2). Incidentally, FIG. 6 shows the case where the diode DIO is built in the semiconductor device SD.

Figure 7:
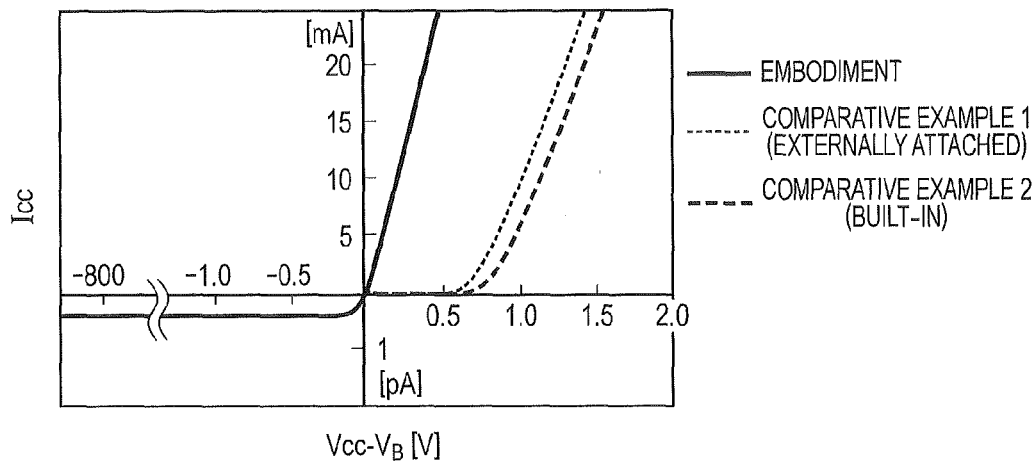
FIG. 7 is a diagram showing a relationship between a difference in potential between two power supply wirings and current flowing in a capacitive element.

FIG. 7 shows a relationship between a difference in potential ($V_{cc}-V_B$) between the power supply wiring VINC1 and the power supply wiring VINC2 and current $I_{cc}$ flowing in the capacitive element BSC in the semiconductor devices SDs according to the comparative examples 1 and 2 and the semiconductor device SD according to the present embodiment. In the semiconductor device SD according to each comparative example, no current $I_{cc}$ flows until the potential difference ($V_{cc}-V_B$) reaches 0.6V or so, whereas in the semiconductor device SD according to the embodiment, the current $I_{cc}$ starts to flow when the potential difference ($V_{cc}-V_B$) exceeds 0V.

Figure 8:
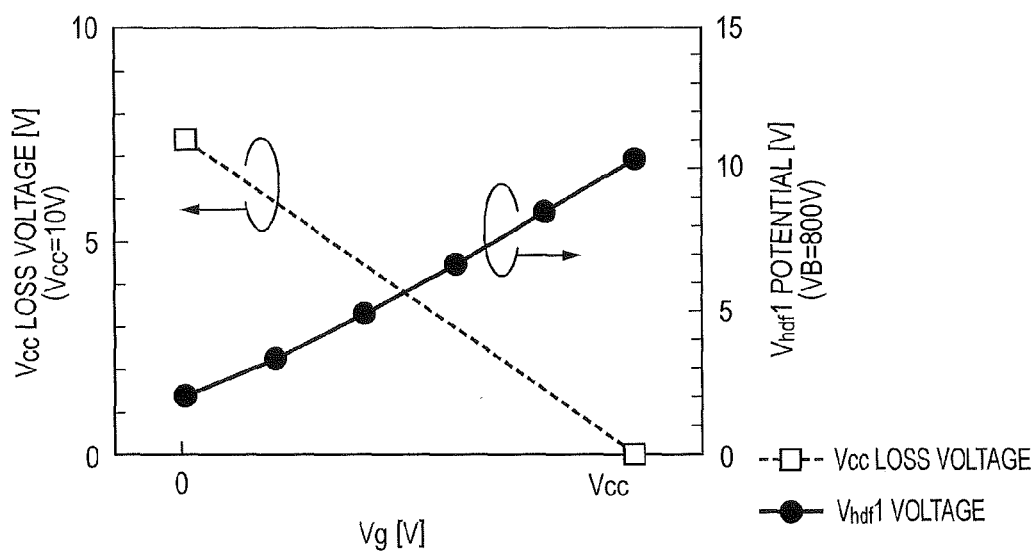
FIG. 8 is a diagram showing a relationship between a potential $V_g$ applied to a first conductive film by a voltage control circuit and a voltage lost in a rectifying element, and showing a relationship between the potential $V_g$ and a potential of a first high concentration second conductivity type region.

FIG. 8 shows a relationship between a potential $V_g$ applied to the first conductive film CG by the voltage control circuit PCC and a voltage ($V_{cc}$ loss voltage) lost in the rectifying element HRD. Also FIG. 8 shows a relationship between the potential $V_g$ and a potential of the first high concentration second conductivity type region HDF1.

It is understood from FIG. 8 that the potential lost in the rectifying element HRD is reduced as the potential $V_g$ becomes high. On the other hand, the potential of the first high concentration second conductivity type region HDF1 also becomes high as the potential $V_g$ becomes high. When the potential of the first high concentration second conductivity type region HDF1 becomes higher than $V_{cc}$, the current flows reversely in the rectifying element HRD and hence there is a need to prevent the potential of the first high concentration second conductivity type region HDF1 from becoming higher than $V_{cc}$. To this end, the voltage applied to the first conductive film CG by the voltage control circuit PCC is preferably less that or equal to the power supply voltage $V_{cc}$.

FIG. 9 is a diagram for describing the effect of having extended the lower portion BIDF of the first conductivity type region IDF to the first high concentration second conductivity type region HDF1. In the present figure, a width $W_{bdif1}$ is a lower limit value of a preferable range of a width $W_{bdif}$ (refer to FIG. 4) of the lower portion BIDF, and a width $W_{bdif2}$ is an upper limit value of the preferable range of the width $W_{bdif}$.

Figure 9A:
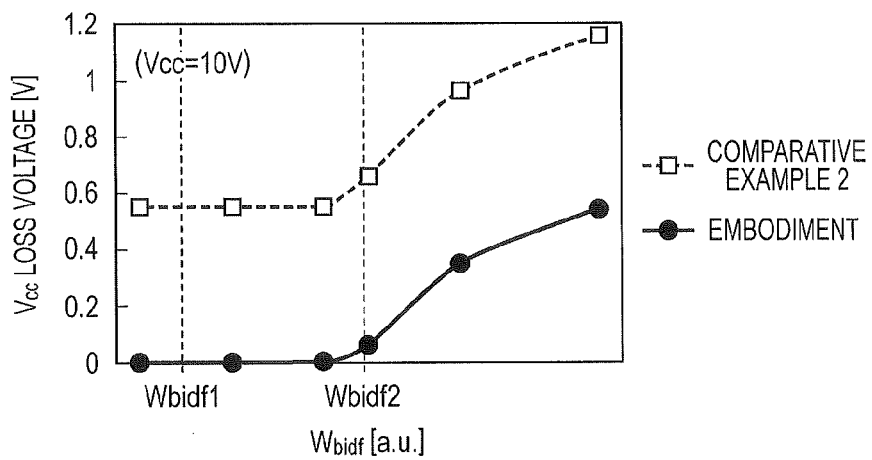
FIG. 9A is a diagram showing a relationship between the width $W_{bdif}$ of a lower portion of a first conductivity type region and a voltage lost in the rectifying element.

Described in detail, FIG. 9A shows a relationship between the width $W_{bdif}$ (refer to FIG. 4) of the lower portion BIDF and a voltage lost ($V_{cc}$ loss voltage) in the rectifying element HRD. When the width $W_{bdif}$ of the lower portion BIDF is expanded to a certain extent as shown in the present figure, the $V_{cc}$ loss voltage occurs even in both of the comparative example 2 and the embodiment. This is because when the width $W_{bdif}$ of the lower portion BIDF is expanded, a depletion layer due to the lower portion BIDF extends within the second conductivity type layer LDR2. Therefore, the width $W_{bdif}$ of the lower portion BIDF is preferably less than or equal to the width $W_{bdif2}$ with which the $V_{cc}$ loss voltage starts to be generated. The semiconductor device SD according to the embodiment is however low in $V_{cc}$ loss voltage.

Figure 9B:
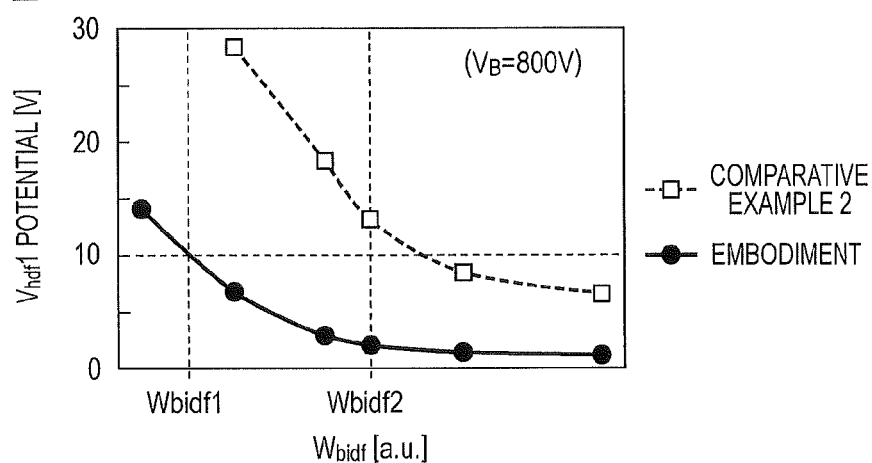
FIG. 9B is a diagram showing a relationship between the width $W_{bdif}$ and the potential of the first high concentration second conductivity type region.

FIG. 9B shows a relationship between the width $W_{bdif}$ and the potential of the first high concentration second conductivity type region HDF1. When the width $W_{bdif}$ of the lower portion BIDF is expanded as shown in the present figure, the potential of the first high concentration second conductivity type region HDF1 becomes low even in both the comparative example 2 and the embodiment. The semiconductor device SD according to the embodiment is low in terms of the potential of the first high concentration second conductivity type region HDF1.

Figure 9C:
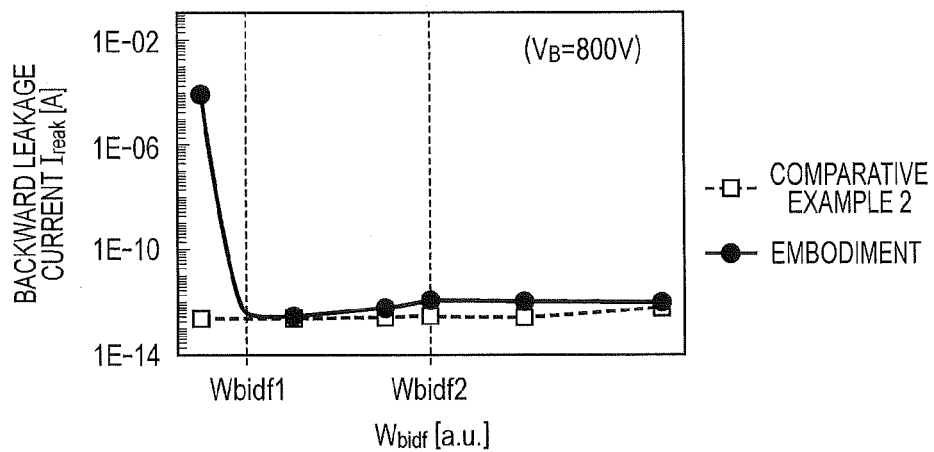
FIG. 9C is a diagram showing a relationship between the width $W_{bdif}$ and current reversely flowing through the rectifying element while the rectifying element is off.

FIG. 9C shows a relationship between the width $W_{bdif}$ and current that reversely flows through the rectifying element HRD while the rectifying element HRD is off. In the present embodiment as shown in the present figure, the current that reversely flows through the rectifying element HRD increases when the width $W_{bdif}$ of the lower portion BIDF is set to less than a certain value ($W_{bdif1}$). Therefore, the width $W_{bdif}$ of the lower portion BIDF is preferably set to greater than or equal to the width $W_{bdif1}$.

Second Embodiment

FIG. 10 is a cross-sectional diagram for describing a configuration of a semiconductor device SD according to a second embodiment and corresponds to FIG. 3 in the first embodiment. The semiconductor device SD according to the present embodiment is similar in configuration to the semiconductor device SD according to the first embodiment except that it has a third high concentration second conductivity type region AF.

The third high concentration second conductivity type region AF is formed in a portion positioned below the first insulation layer CGINS in the second conductivity type layer LDR2 and is higher in impurity concentration than the second conductivity type layer LDR2. The impurity concentration of the third high concentration second conductivity type region AF is however preferably lower than that of the second high concentration second conductivity type region HDF2.

An advantageous effect similar to that in the first embodiment is obtained even by the present embodiment. Since the third high concentration second conductivity type region AF is provided, carries are likely to be collected in a region directly below the first conductive film CG in the second conductivity type layer LDR2 when the voltage control circuit PCC applies a potential different from a ground potential to the first conductive film CG. Thus, the rectifying element HRD becomes easy to turn on, and a voltage ($V_{cc}$ loss voltage) lost in the rectifying element HRD becomes hard to occur.

Third Embodiment

Figure 11:
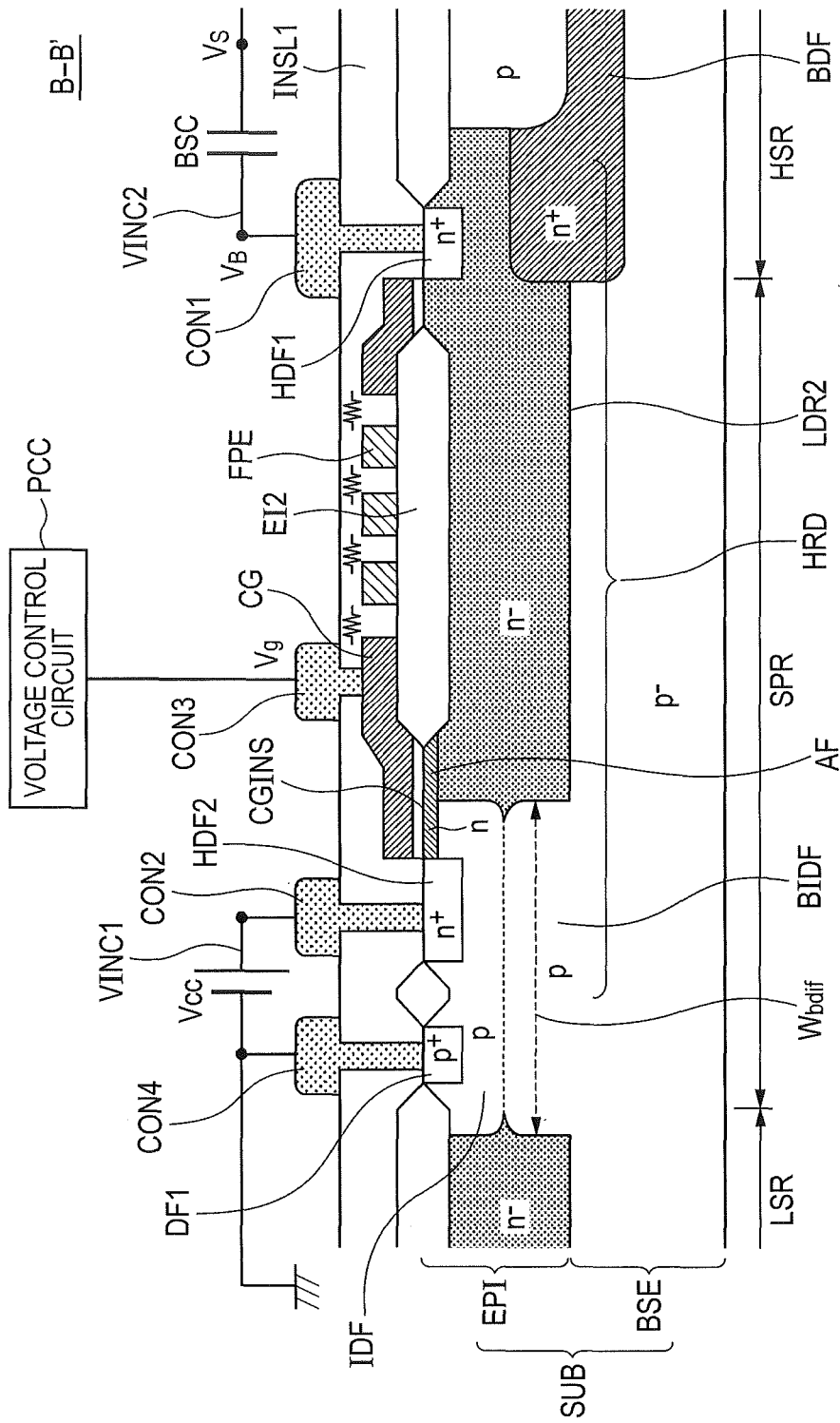
FIG. 11 is a cross-sectional diagram for describing a configuration of a semiconductor device according to a third embodiment.

FIG. 11 is a cross-sectional diagram for describing a configuration of a semiconductor device SD according to a third embodiment and corresponds to FIG. 3 in the first embodiment. The semiconductor device SD according to the present embodiment is similar in configuration to the semiconductor device SD according to the second embodiment except for the following points.

First, the lower portion BIDF of the first conductivity type region IDF is not projected downwardly of the second high concentration second conductivity type region HDF2. Instead, the whole first conductivity type region IDF is extended out toward the second high concentration second conductivity type region HDF2. As a result, the second high concentration second conductivity type region HDF2 and the third high concentration second conductivity type region AF are surrounded by the first conductivity type region IDF and formed in the first conductivity type region IDF. Further, the second conductivity type layer LDR2 and the second high concentration second conductivity type region HDF2 are coupled to each other through the third high concentration second conductivity type region AF.

An advantageous effect similar to that in the second embodiment is obtained even by the present embodiment. Further, the second high concentration second conductivity type region HDF2 and the second conductivity type layer LDR2 are not directly coupled to each other and are coupled to each other through the third high concentration second conductivity type region AF. The third high concentration second conductivity type region AF is thinner than the second high concentration second conductivity type region HDF2. Therefore, even if the impurity concentration of the second conductivity type layer LDR2 is made thick, the potential of the second high concentration second conductivity type region HDF2 is hard to be high when the rectifying element HRD is off (i.e., when the potential applied to the first high concentration second conductivity type region HDF1 becomes high). Incidentally, when the potential of the second high concentration second conductivity type region HDF2 becomes high and exceeds the power supply potential $V_{cc}$, the current flows in the substrate SUB and the second circuit region LSR.

In order to turn off the rectifying element HRD, a portion of the third high concentration second conductivity type region AF, which overlaps with the first conductivity type region IDF, may be depleted. Therefore, even if the second conductivity type layer LDR2 is set thick in impurity concentration, the rectifying element HRD can be turned off by controlling the potential applied to the first conductive film CG.

Further, the second conductivity type layer LDR2 is made thick in impurity concentration to thereby make it possible to reduce the resistance of the second conductivity type layer LDR2 and increase an on-current of the rectifying element HRD. It is thus possible to enhance charging efficiency for the capacitive element BSC.

While the invention made above by the present inventors has been described specifically on the basis of the preferred embodiments, the present invention is not limited to the embodiments referred to above. It is needless to say that various changes can be made thereto within the scope not departing from the gist thereof.

What is claimed is:

1. A method of controlling a power supply to a semiconductor device including a first region having a high-side drive circuit, a second region having a signal processing circuit, a low-side drive circuit and a voltage control circuit, and a separation region formed between the first and second regions and having a rectifying element, comprising:
   turning on a first control signal to the voltage control circuit, such that:
      the voltage control circuit applies a voltage $V_{cc}$ to the first conductive film of the rectifying element, to turn on the rectifying element; and
      a voltage $V_B$ for a power supply wiring of the high-side drive circuit gradually rises to the voltage $V_{cc}$;
   turning off the first control signal to the voltage control circuit, such that:
      the voltage control circuit applies a ground voltage to the first conductive film of the rectifying element, to turn off the rectifying element; and
      the voltage $V_B$ for the power supply wiring of the high-side drive circuit gradually rises to a voltage $HV+V_{cc}$, where HV is a voltage of a power supply coupled to the semiconductor device; and
   repeating the turning on of the first control signal and the turning off of the first control signal.

2. The method of claim 1, wherein the second region further comprises a signal processing circuit which controls the low-side drive circuit based on the first control signal, and controls the high-side drive circuit based on a second control signal.

3. The method of claim 2, further comprising:
   turning off the second control signal at a time of the turning on the first control signal; and
   turning on the second control signal at a time of the turning off the first control signal.

4. The method of claim 3, wherein the power supply is coupled to the semiconductor device via a capacitive element, and after the voltage $V_B$ gradually rises to the voltage $HV+V_{cc}$:
   the high-side drive circuit is operated using power accumulated in the capacitive element; and
   the voltage $V_B$ of the power supply wiring is gradually reduced.

5. The method of claim 4, wherein the capacitive element is included in a power control circuit which further comprises a first transistor controlled by the high-side drive circuit and a second transistor controlled by the low-side drive circuit.

6. The method of claim 5, further comprising:
   at a time of turning on the first control signal and turning off the second control signal:
      turning off the first transistor with the high-side drive circuit; and
      turning on the second transistor with the low-side drive circuit, to apply a ground potential to a terminal of the capacitive element.

7. The method of claim 1, wherein a time at which a voltage $V_L$ starts to be applied to the first conductive film is delayed from the turning on of the control signal.

8. The method of claim 1, wherein the rectifying element separates the power supply wiring of the high-side drive circuit from a power supply wiring of the signal processing circuit.

9. The method of claim 1, wherein the semiconductor device comprises a substrate including a first conductivity type substrate, and a first conductivity type region formed on an outer periphery of the separation region, and
   wherein the rectifying element comprises:
      a second conductivity type layer formed in the first conductivity type substrate;
      a first high concentration second conductivity type region formed in the second conductivity type layer;
      a second high concentration second conductivity type region formed in the second conductivity type layer and away from the first high concentration second conductivity type region, a bottom portion of the first conductivity type region being formed beneath the second high concentration second conductivity type region such that the second conductivity type layer is formed between the bottom portion of the first conductivity type region and the second high concentration second conductivity type region;
      an element isolation film formed on the substrate between the first high concentration second conductivity type region and the second high concentration second conductivity type region and away from the second high concentration second conductivity type region;
      a first insulation film formed over a region of the substrate, the region being positioned between the second high concentration second conductivity type region and the element isolation film; and a first conductive film formed over the first insulation film.

10. The method of claim 9, wherein the first conductivity type substrate is bonded to a bottom surface of the second conductivity type layer.

11. The method of claim 10, wherein in the turning off of the control signal:
   a depletion layer spreads from the bottom surface of the second conductivity type layer, until an entirety of the second conductivity type layer is depleted; and
   no current flows between the first high concentration second conductivity type region and the second high concentration second conductivity type region, such that the rectifying element is turned off.

12. The method of claim 9, wherein the bottom portion of the first conductivity type region extends downward of the second high concentration second conductivity type region, and a region positioned in a periphery of the second high concentration second conductivity type region in the second conductivity type layer becomes easily depleted.

13. The method of claim 9, wherein the voltage control circuit applies a fixed potential to the first conductive film without being synchronized with the first control signal, such that the voltage applied to the first conductive film by the voltage control circuit is greater than or equal to the ground voltage and less than or equal to the voltage $V_{cc}$.

14. The method of claim 9, wherein when the voltage applied to the first high concentration second conductivity type region becomes high, carriers are pushed out of the region positioned around the second high concentration second conductivity type region in the second conductivity type layer by an electric field caused by the fixed potential applied to the first conductive film, such that the portion positioned around at least the second high concentration second conductivity type region in the second conductivity type layer is depleted and the rectifying element is turned off.

* * * * *